United States Patent
Grube

(10) Patent No.: US 6,870,381 B2
(45) Date of Patent: Mar. 22, 2005

(54) INSULATIVE COVERING OF PROBE TIPS

(75) Inventor: Gary W. Grube, Pleasanton, CA (US)

(73) Assignee: FormFactor, Inc., Livermore, CA (US)

(*) Notice: Subject to any disclaimer, the term of this patent is extended or adjusted under 35 U.S.C. 154(b) by 0 days.

(21) Appl. No.: 10/607,628

(22) Filed: Jun. 27, 2003

(65) Prior Publication Data

US 2004/0266234 A1 Dec. 30, 2004

(51) Int. Cl.⁷ .............................................. G01R 31/02

(52) U.S. Cl. ...................... 324/754; 324/757

(58) Field of Search .................... 439/148, 65–67; 324/754, 762, 765, 757; 438/14, 17, 107; 174/256; 257/48, 737; 29/840, 842, 593

(56) References Cited

U.S. PATENT DOCUMENTS

| | | | | |
|---|---|---|---|---|
| 5,831,441 A | * | 11/1998 | Motooka et al. | 324/754 |
| 6,181,145 B1 | * | 1/2001 | Tomita et al. | 324/754 |
| 6,211,691 B1 | * | 4/2001 | Okuno | 324/762 |
| 6,366,112 B1 | * | 4/2002 | Doherty et al. | 324/765 |
| 6,563,215 B1 | * | 5/2003 | Akram et al. | 257/737 |
| 6,800,506 B1 | * | 10/2004 | Lin et al. | 438/107 |

\* cited by examiner

*Primary Examiner*—Alex Gilman
(74) *Attorney, Agent, or Firm*—N. Kenneth Burraston

(57) ABSTRACT

An insulative material is applied to one or more selected probe tips to disable those probes, and the probes are brought into contact with a semiconductor die. One or more tests are run on the die to verify sufficient testing of the die without the disabled probes. The process may be repeated with other probes disabled to determine which probes need not be used in testing the die.

9 Claims, 5 Drawing Sheets

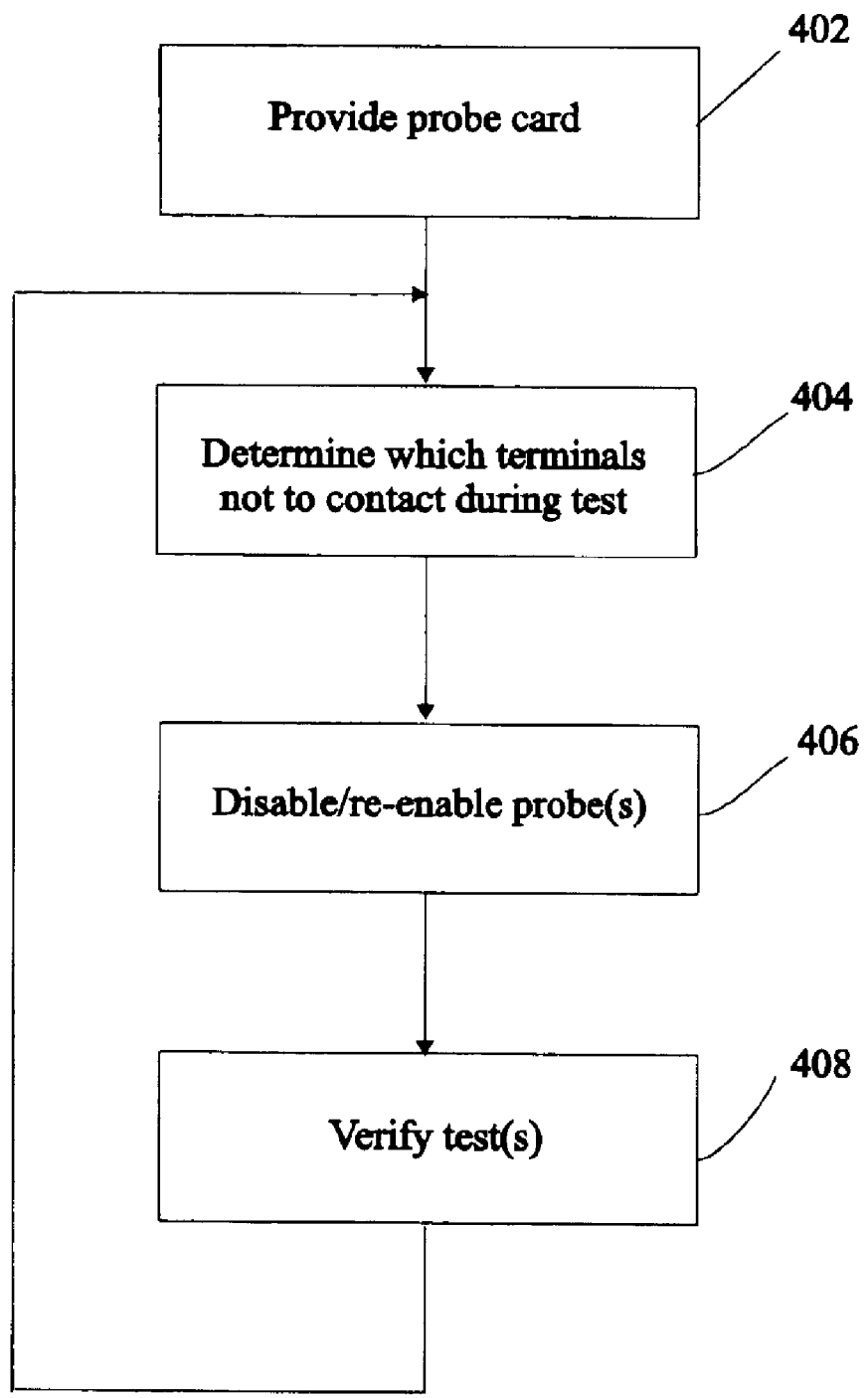

INSULATIVE COVERING OF PROBE TIPS

1. FIELD OF THE INVENTION

This invention relates generally to probing devices.

2. BACKGROUND OF THE INVENTION

FIG. 1A illustrates an exemplary probe card 100 used for probing semiconductor wafers to test the wafers. As shown, the probe card 100 includes a printed circuit board 106, a mounting bracket 102, and needle probes 104. Traces, vias, wiring, and/or other electrical interconnections connect contact pads 116 (see FIGS. 1A and 1B) on the opposite side of printed circuit board 106 with probes 104. The contact pads 116 provide an interface to a tester. As shown in FIG. 1B, the probes 104 make temporary contact with terminals 112 on one or more dice 110 of a semiconductor wafer 108. While the probes 104 are in temporary contact with the die or dice 110, the die or dice 110 are tested.

Often, a die 110 can be sufficiently tested without contacting all of the terminals 112 on the die 110. Any such test scheme, however, typically is verified using a probe card 100 that includes probes 104 for contacting all or most of the terminals 112 on a die 110. During such verification, test engineers typically disable one or more of the probes 104, run tests on a die 110, and then determine whether the die 110 was sufficiently tested without the disabled probes. In the past, test engineers have typically used needle-type probe cards during this test verification stage, and they typically disabled a probe by bending the probe such that it will not make contact with a terminal on a die. FIGS. 1B and 1C illustrate an example. As shown in FIG. 1B, probes 104a and 104b are positioned to make contacts with terminals 112 on a die 110. As shown in FIG. 1C, probe 104b is bent such that it no longer makes contact with a terminal 112. If it is later determined that probe 104b is needed, it is simply bent back into a position in which it will make contact with a terminal 112.

SUMMARY OF THE INVENTION

This invention relates generally to probing devices. In one embodiment of the invention, an insulative material is applied to one or more selected probe tips to disable those probes. The probes are then brought into contact with a semiconductor die, and one or more tests are run on the die to verify sufficient testing of the die without the disabled probes. The process may be repeated with other probes disabled to determine which probes need not be used in testing the die.

BRIEF DESCRIPTION OF THE DRAWINGS

FIG. 4 illustrates an exemplary method in which probe tips are selectively disabled and re-enabled as needed.

DETAILED DESCRIPTION OF EMBODIMENTS OF THE INVENTION

The present invention relates generally to probing devices. This specification describes exemplary embodiments and applications of the invention. The invention, however, is not limited to these exemplary embodiments and applications or to the manner in which the exemplary embodiments and applications operate or are described in this specification.

Figure 2A:
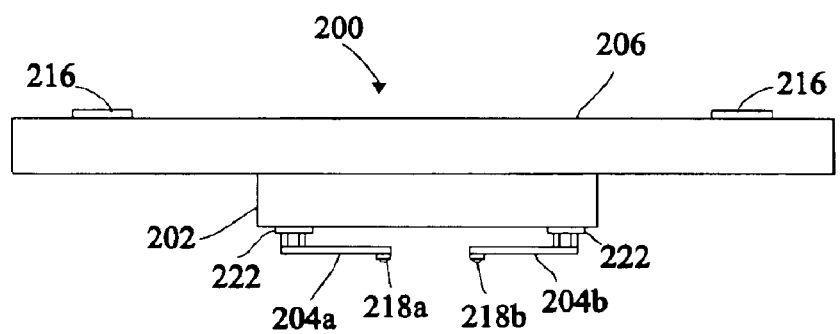
FIG. 2A illustrates an exemplary probe card.

FIG. 2A illustrates an exemplary probe card 200, which for illustration purposes includes an interface substrate 206, a mounting substrate 202 with pads 222, and a plurality of probes (two probes 204a, 204b are shown) mounted to the pads 222. Interface substrate 206 includes tester contacts 216 for connecting to a tester (not shown). Traces, vias, wiring, and/or other electrical interconnections connect contact tester contacts 216 and probes 204a, 204b. Electrical components, including passive components (e.g., resistors, capacitors, etc.) and/or active components (e.g., a microprocessor), may be included and connected to any of the traces, vias, etc. Interface substrate 206 may be any type of substrate, including a printed circuit board. Tester contacts 216 may be, for example, contact pads or terminals. Mounting substrate 202 may also be any type of substrate, including without limitation a ceramic substrate or a mounting bracket.

Probe card 200 is exemplary only, and any type of probe card or probing device may be used. As just one example, probe card 200 may alternatively have a structure like the probe cards described in U.S. Pat. No. 5,974,662 or U.S. patent No. [P101], which are incorporated herein by reference in their entirety. Probes 204a, 204b may likewise be any type of probes for establishing electrical connections with another electrical device. Nonexclusive examples of such probes include needle probes, buckling beam probes, bump probes, and spring probes. Nonexclusive examples of spring probes include springs probes as described in U.S. Pat. No. 5,917,707, U.S. Pat. No. 6,482,013, U.S. Pat. No. 6,268,015, U.S. U.S. patent application Publication No. 2001/0044225 A1, and U.S. patent application Publication No. 2001/0012739 A1, all of which are incorporated herein in their entirety by reference. The exemplary probes shown in FIGS. 2A–3B are cantilevered beam probes, which may be similar to cantilevered beam probes described in any of the foregoing patents and published patent applications.

Figure 2B:
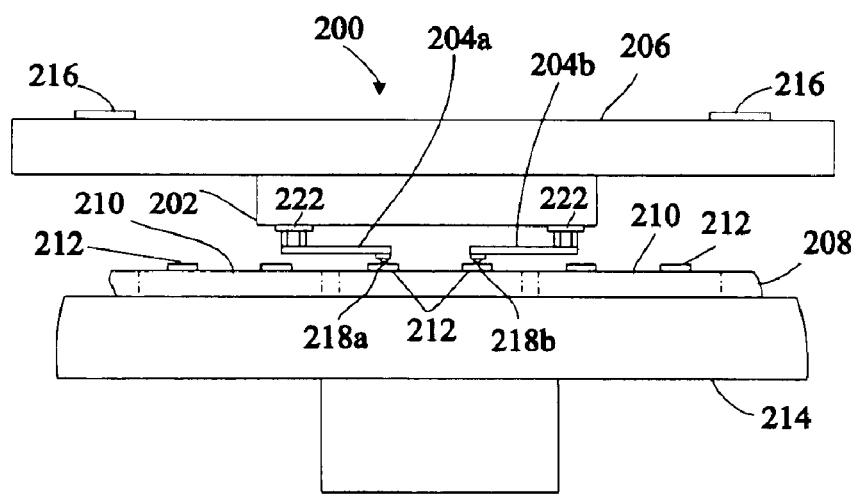
FIG. 2B illustrates the probe card shown in FIG. 2A contacting a wafer.

As shown in FIG. 2B, the tips 218a, 218b of probes 204a, 204b are brought into contact with terminals 212 of one or more dice 210 on a wafer 208 to be tested. Typically, this is done by placing the wafer 208 on a moveable chuck 214 in a prober (not shown) and moving the chuck 214 such that terminals 212 are brought into contact with probes 204a, 204b. Test data is then communicated to and from the die or dice 212 being contacted through probe card to a tester (not shown).

Figure 3A:
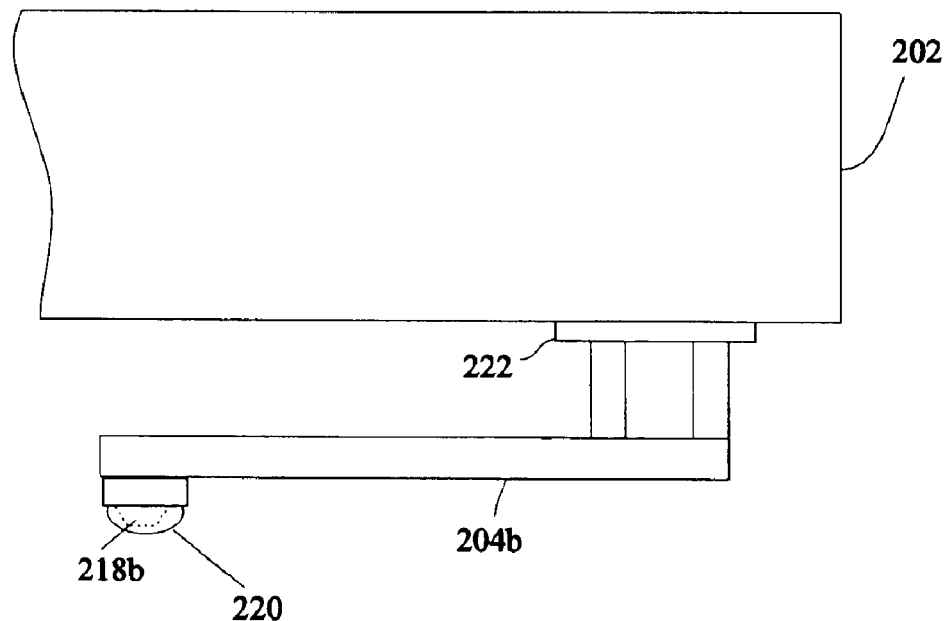
FIG. 3A illustrates a partial side view of the probe card of FIG. 2A with an exemplary insulative material applied to the tip of a probe.
Figure 3B:
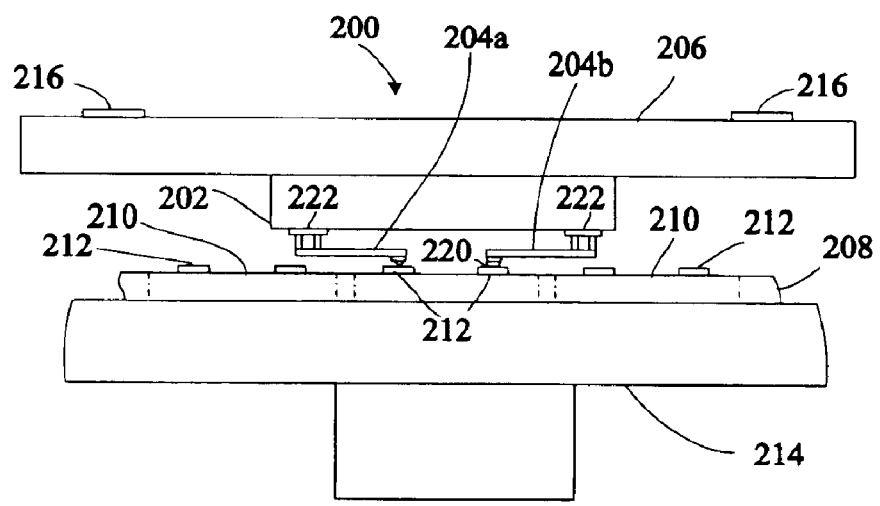
FIG. 3B illustrates the probe card shown in FIG. 3A with the insulative material on one probe contacting a wafer.

FIG. 3A illustrates a scheme for "disabling" probe 204b. As shown, an insulative material 220 is applied over the tip 218b of probe 204b. No such insulative material is applied, however, to the tip 218a of probe 204a (not shown in FIG. 3A). As shown in 3B, probes 204a and 204b are brought into contact with terminals 212 on wafer 208, as discussed above with respect to FIG. 2B. Because of the insulative material 220 on tip 218b, however, probe 204b does not make an electrical connection with the terminal 212 it contacts. In this way, probe 204b may be temporarily and reversibly "disable."

The insulative material 220 may be any material capable of providing electrical insulation. Examples of such materials include without limitation epoxies, nylons, starches, vinyls, styrenes, polyethylenes, polyproylenes, thermoplastics, rubbers, etc. The insulative material 220 may be applied in any suitable manner. A probe 204 that is temporarily disabled may be re-enabled by removing the insulative material 220. The insulative material 220 may be removed in any suitable manner, including without limitation by dissolving, laser ablation, peeling, air blast, water blast, burning, sublimation, etc.

Figure 1A:
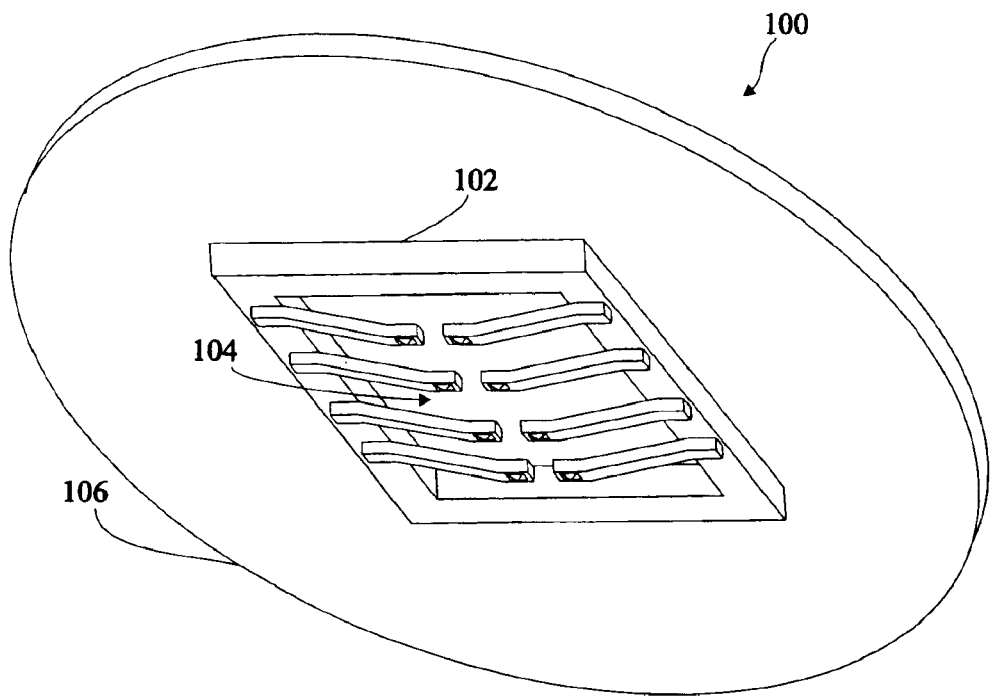
FIG. 1A illustrates a prior art probe card with needle probes.
Figure 1B:
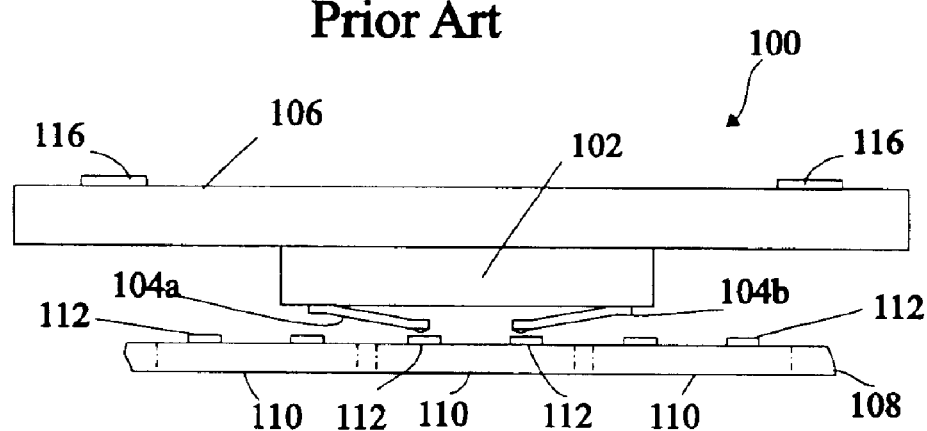
FIG. 1B illustrates a side view of the prior art probe card of FIG. 1A making contact with a semiconductor wafer to be tested.
Figure 1C:
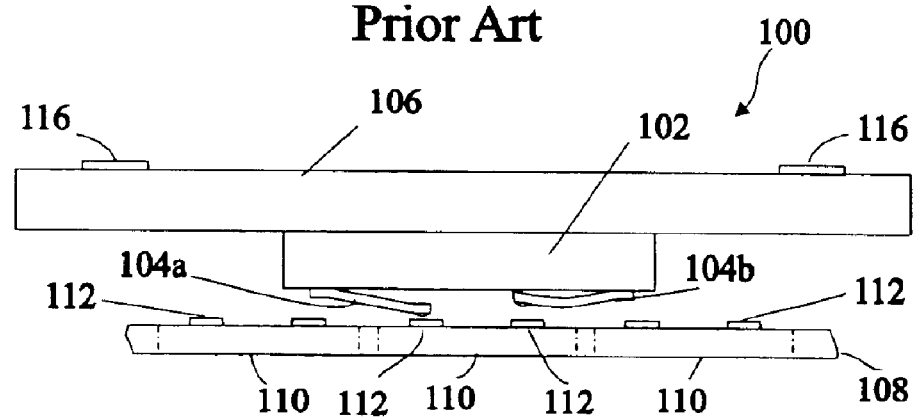
FIG. 1C illustrates a side view of the prior art probe card of FIG. 1B after one of the probes has been bent such that is does not make contact with the semiconductor wafer to be tested.

FIG. 4 illustrates an exemplary process for using the present invention. As shown, a probe card is provided at step 402. The probe card may be similar to one of the exemplary probe cards illustrated in FIG. 1A or 2A or as otherwise described above. Preferably, the probe card includes sufficient probes for contacting all the terminals on at least one die to be tested. The probe card may, however, include fewer probes. For example, if it is reasonably certain that certain ones of the terminals on a die need not be contacted to sufficiently test the die, the probe card might not need to have probes that correspond to those terminals.

Next, it is determined at step 404 which terminals on the die may not need to be contacted during testing of the die. This determination may be made in any suitable manner. For example, a test engineer may examine the die design and, based on the design, determine that certain terminals need not be contacted during test. As another example, the terminals may be selected at random.

At step 406, probes corresponding to the terminals determined at step 404 are disabled. This step may be performed by applying an insulative material over the tips of the corresponding probes, as discussed above with respect to FIG. 3A. As will be discussed below, step 406 may also include re-enabling previously disabled probes, which may be performed by removing the insulative material previously applied to the tips of those probes, as also discussed above.

At step 408, tests are performed on the die, and it is determined whether the tests worked properly with the terminals disabled as in step 406 above. If it is determined that the tests did not work properly, steps 404, 406, and 408 are repeated. That is, other terminals are selected at step 404, the probes of the probe card are disabled or re-enabled as necessary at step 406 such that only those probes that correspond to the terminals not to be contacted as determined at step 404 are disabled, and the tests are verified again at step 408. Steps 404, 406, and 408 may be repeated as many times as needed. Although not shown in FIG. 4, thereafter probe cards having only probes corresponding to terminals that need to be contacted during test may be obtained and used to test production wafers after their manufacture.

Although the principles of the present invention have been illustrated and explained in the context of specific embodiments, it will be appreciated by those having skill in the art that various modifications beyond those illustrated can be made to the disclosed embodiments without departing from the principles of the present invention.

For example, although the above-described embodiments illustrate a probe card for probing unsingulated semiconductor wafers, the invention is equally applicable to any testing of an electronic device in which probes are brought into contact with terminals or other contact points or features on the electronic device for the purpose of testing the electronic foregoing include sockets and test probes for packaged or or devices, including singulated semiconductor dice.

What is claimed is:

1. A method of determining terminals of a semiconductor die to contact during test, said method comprising:

selecting a first subset of said terminals not to contact during testing of said die;

covering with an electrically insulative material tip(s) of a first subset of probes corresponding to said first subset of terminals, wherein said first subset of probes composes a plurality of probes corresponding to ones of said terminals;

bringing said plurality of probes into contact with said ones of said terminals of said die; and verifying testing of said die.

2. The method of claim 1, wherein said first subset of terminals comprises one terminal.

3. The method of claim 1, wherein said first subset of terminals comprises at least two terminals.

4. The method of claim 1, wherein said plurality of probes are disposed on a probe card.

5. The method of claim 1, wherein said die composes an unsingulated semiconductor wafer.

6. The method of claim 1, wherein said insulative material comprises a material selected from one of an epoxy, a nylon, a starch, a vinyl, a styrene, a polyethylene, a polyproylene, a thermoplastic, or a rubber.

7. The method of claim 1, wherein said plurality of probes arm cantilevered beam probes.

8. The method of claim 1, wherein, if said testing of said die does not verify, said method further comprises:

selecting a second subset of said terminals not to contact during testing of said die;

removing said insulative material from said tip(s) of said first subset of probes;

covering with an insulative material tip(s) of a second subset of probes corresponding to said second subset of terminals;

bringing said plurality of probes into contact with said ones of said terminals of said die; and verifying testing of said die.

9. The method of claim 8, wherein said step of removing said insulative material comprises removing said insulative material by dissolving, laser ablating, peeling, air blasting, water blasting, burning, or subliming said insulative material.

* * * * *